US012772581B2

(12) United States Patent
Mccarten et al.

(10) Patent No.: US 12,772,581 B2
(45) Date of Patent: Oct. 20, 2026

(54) BACKSIDE ILLUMINATION GLOBAL SHUTTER IMAGE SENSOR WITH TRENCH STORAGE GATE

(71) Applicant: SEMICONDUCTOR COMPONENTS INDUSTRIES, LLC, Scottsdale, AZ (US)

(72) Inventors: John P. Mccarten, Penfield, NY (US); Hung Q. Doan, Rochester, NY (US); Konstantin G. Korablev, Penfield, NY (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 394 days.

(21) Appl. No.: 18/522,821

(22) Filed: Nov. 29, 2023

(65) Prior Publication Data

US 2025/0176284 A1 May 29, 2025

(51) Int. Cl.

*H10F 39/12* (2025.01)
*H10F 39/00* (2025.01)
*H10F 39/18* (2025.01)

(52) U.S. Cl.

CPC ......... *H10F 39/199* (2025.01); *H10F 39/014* (2025.01); *H10F 39/024* (2025.01); *H10F 39/18* (2025.01); *H10F 39/8037* (2025.01)

(58) Field of Classification Search

CPC ..................................................... H10F 39/199
See application file for complete search history.

(56) References Cited

U.S. PATENT DOCUMENTS 9,515,116 B1 12/2016 Sze et al.
9,570,507 B2 2/2017 Nozaki et al.
10,304,886 B2 * 5/2019 Chiang ................. H10F 39/014
10,432,883 B1 * 10/2019 Chapman ............... H04N 25/77
10,741,593 B1 * 8/2020 Mabuchi .............. H04N 25/622
2010/0230729 A1 9/2010 Ellis-Monaghan et al.
2015/0349001 A1 * 12/2015 Wang .................... H10F 39/014 257/443
2017/0134683 A1 * 5/2017 Guyader .............. H04N 25/767
2018/0301502 A1 10/2018 Lee et al.

FOREIGN PATENT DOCUMENTS

WO 2015020821 A2 2/2015

OTHER PUBLICATIONS

Y. Kumagai et al., "Back-Illuminated 2.74 μm-Pixel-Pitch Global Shutter CMOS Image Sensor with Charge-Domain Memory Achieving 10k e-Saturation Signal," 2018 IEEE, IEDM18, pp. 237-240.
A. Tournier et al., "A HDR 98dB 3.2 μm Charge Domain Global Shutter CMOS Image Sensor," 2018 IEEE, IEDM18, pp. 229-232.
F. Roy et al., "Back Side Illuminated, Fully Depleted, Pinned Trench Photo MOS for Imaging Application," 4 pages.

* cited by examiner

*Primary Examiner* — William A Harriston
(74) *Attorney, Agent, or Firm* — Brett J. Thompsen

(57) ABSTRACT

An image sensor may include an array of global shutter image pixels arranged in rows and columns. Each global shutter image pixel may include a storage gate implemented as a trench transistor. The storage gate may be at least partially covered by a corresponding backside deep trench isolation structure. The deep trench isolation structure can be filled with light-shielding material. Configured in this way, the global shutter image pixel exhibits improved global shutter efficiency.

18 Claims, 6 Drawing Sheets

BACKSIDE ILLUMINATION GLOBAL SHUTTER IMAGE SENSOR WITH TRENCH STORAGE GATE

BACKGROUND

This relates generally to imaging devices and more particularly, to image sensors with charge transfer gates.

Image sensors are commonly used in electronic devices such as cellular telephones, cameras, and computers to capture images. In a typical arrangement, an image sensor is provided with an array of image pixels arranged in pixel rows and pixel columns. The image sensor can sometimes include global shutter pixels. It can be challenging to design global shutter pixels. If care is not taken, the global shutter pixels may suffer from poor global shutter efficiency, lower charge capacity due to the requirement of an extra storage gate node, and higher pixel noise.

It is within this context that the embodiments described herein arise.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds or thousands or millions of pixels (e.g., megapixels). Image sensors may include control circuitry such as circuitry for operating the pixels and readout circuitry for reading out image signals corresponding to the electric charge generated by the photosensitive elements.

Figure 1:
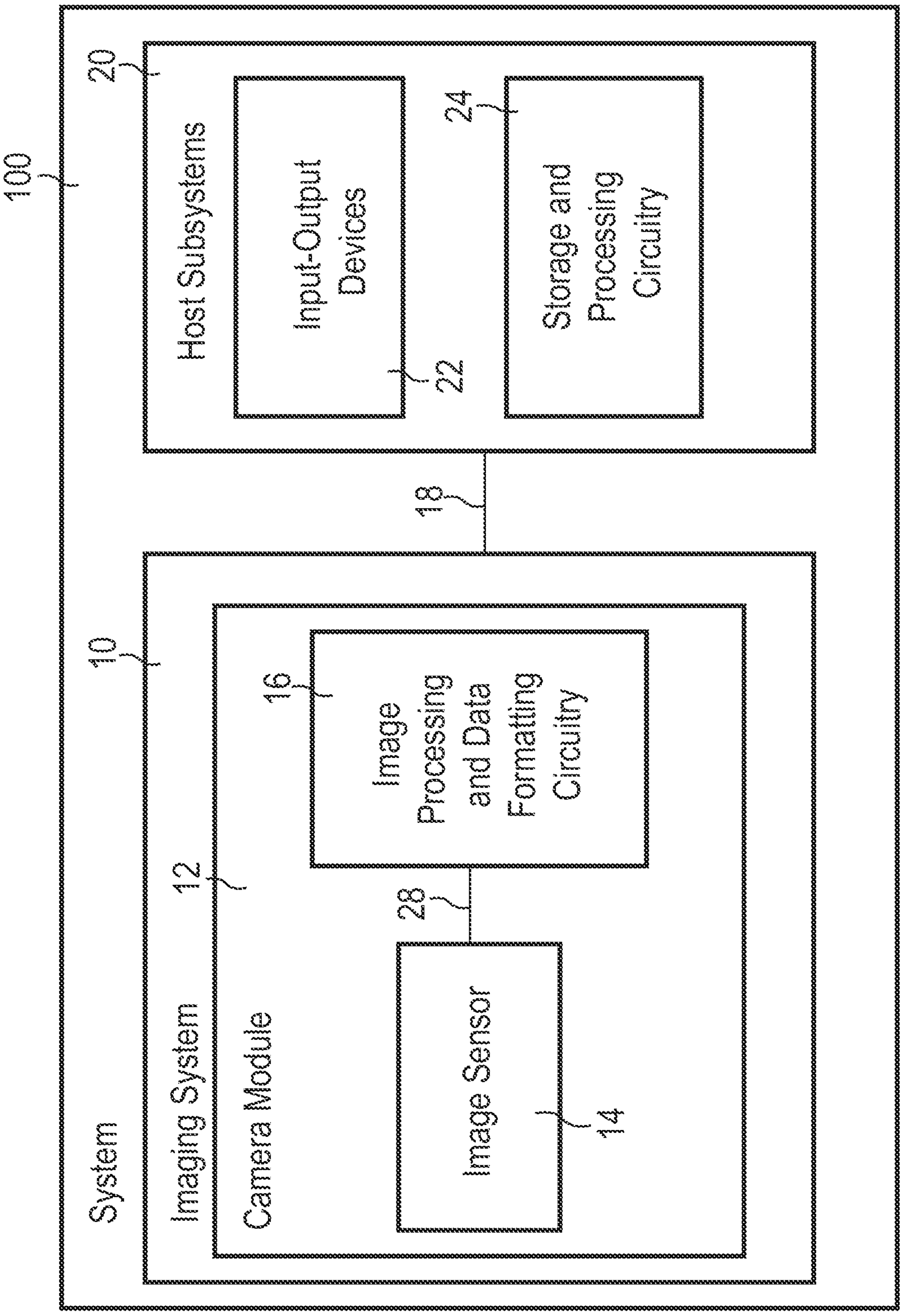
FIG. 1 is a diagram of an illustrative electronic device having an image sensor in accordance with some embodiments.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., image sensor pixels) that convert the light into digital data. Image sensors may have any number of pixels (e.g., hundreds, thousands, millions, or more). A typical image sensor may, for example, have millions of pixels (e.g., megapixels). As examples, image sensor 14 may further include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SoC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
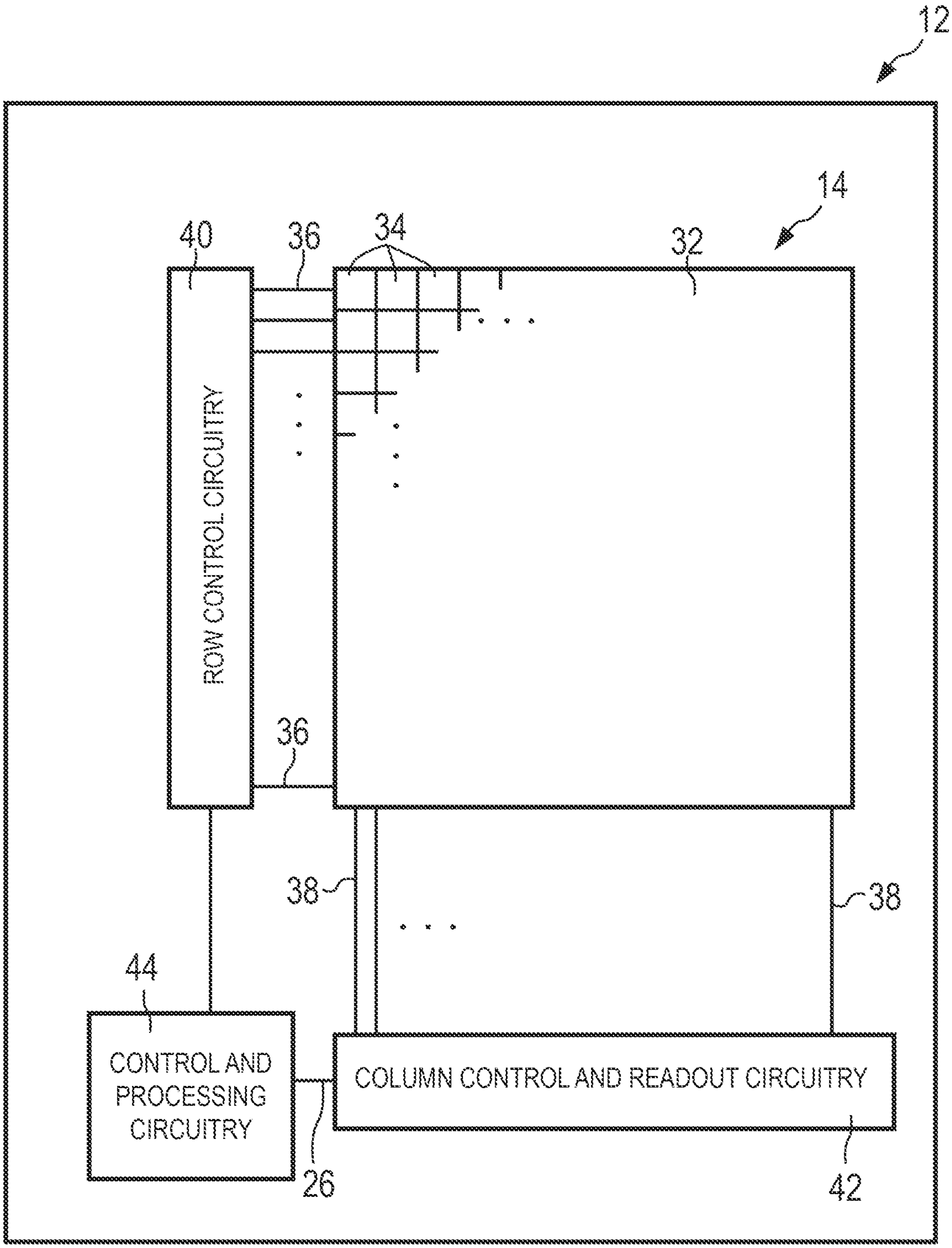
FIG. 2 is a diagram of an illustrative pixel array and associated row and column control circuitry for reading out image signals from an image sensor in accordance with some embodiments.

An example of an arrangement of image sensor 14 of FIG. 1 is shown in FIG. 2. As shown in FIG. 2, image sensor 14 may include control and processing circuitry 44. Control and processing circuitry 44 (sometimes referred to as control and processing logic) may sometimes be considered part of image processing and data formatting circuitry 16 in FIG. 1. Image sensor 14 may include a pixel array such as array 32 of pixels 34 (sometimes referred to herein as image sensor pixels, imaging pixels, or image pixels). Control and processing circuitry 44 may be coupled to row control circuitry 40 via control path 27 and may be coupled to column control and readout circuits 42 via data path 26.

Row control circuitry 40 may receive row addresses from control and processing circuitry 44 and may supply corresponding row control signals to image pixels 34 over control paths 36 (e.g., pixel reset control signals, charge transfer control signals, blooming control signals, row select control signals, dual conversion gain control signals, or any other desired pixel control signals).

Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row driver circuitry 40 and image data associated with image pixels 34 of that pixel row may be read out by column readout circuitry 42 on column lines 38. Column readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel readout values to control and processing logic 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

In general, backside illuminated (BSI) pixel architectures exhibit improved performance relative to front side illuminated (FSI) pixel architectures. However, BSI pixels that uses the global shutter (GS) readout method that relies on charge domain storage nodes often suffer from low global shutter efficiency due to difficulties in shielding in-pixel charge storage nodes from stray light.

Figure 3:
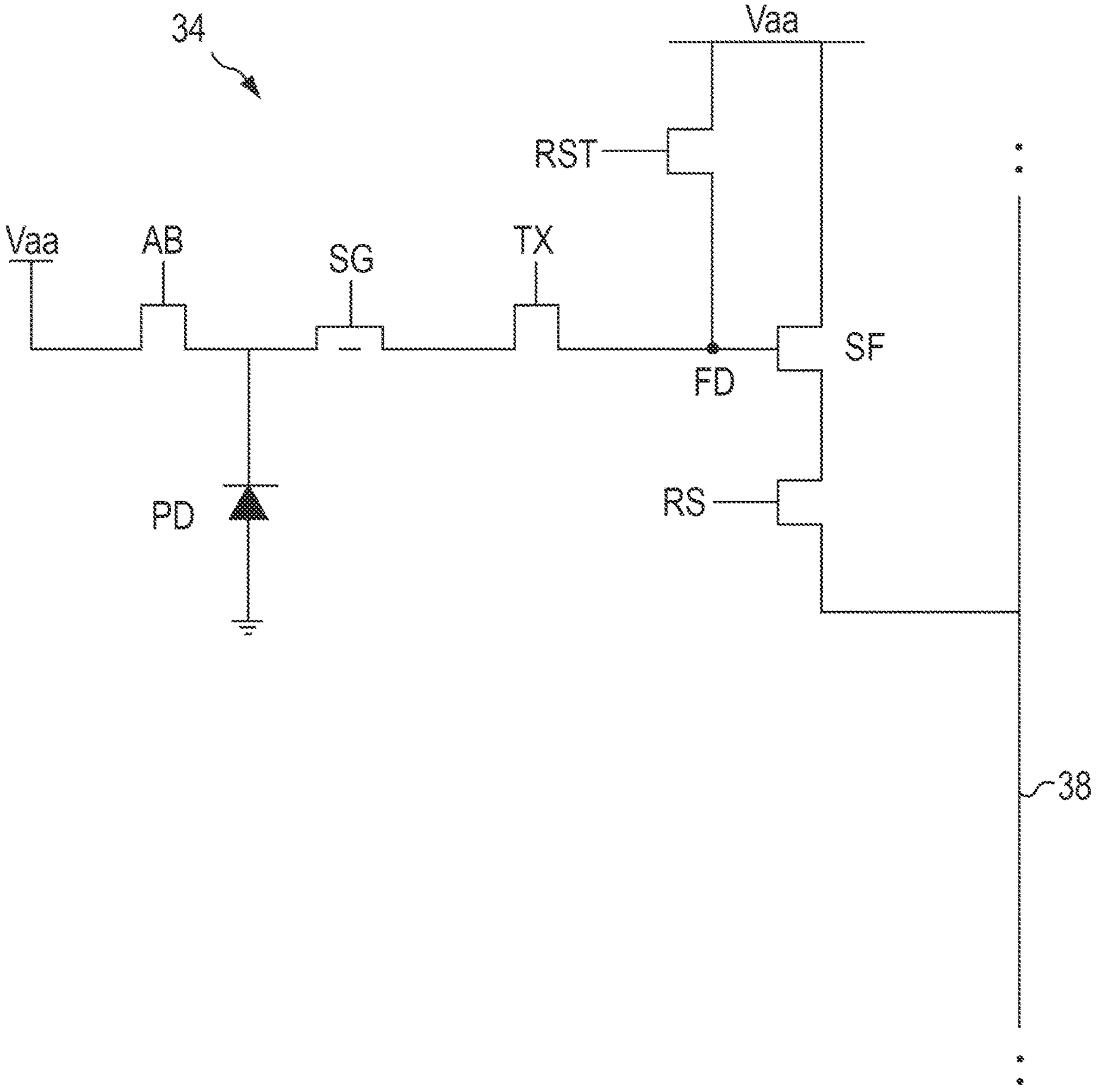
FIG. 3 is a circuit diagram of an illustrative global shutter pixel in accordance with some embodiments.

FIG. 3 shows one suitable circuit implementation of a global shutter image sensor pixel such as pixel 34. As shown in FIG. 3, global shutter pixel 34 may include a photosensitive element such as a pinned photodiode PD that is coupled to an anti-blooming transistor that is at least partially activated using control signal AB in order to draw away blooming charge from the photodiode (e.g., by draining away any excess blooming charge to a positive power supply line on which power supply voltage Vaa is provided). The anti-blooming transistor may also be fully activated using control signal AB to reset the photodiode.

Photodiode PD may be coupled to a storage gate that is controlled by control signal SG. The storage gate may serve as a temporary memory node for pixel 34 and is therefore sometimes referred to as a storage node, storage gate node, storage gate memory node, or global shutter storage node. Storage gate may be coupled to a floating diffusion node FD via a charge transfer transistor controlled by signal TX. The charge transfer transistor is sometimes referred to as a charge transfer gate.

Any charge transferred to floating diffusion node FD causes the potential on this node to change, and this change is sensed by a source follower transistor SF. The source terminal of the source follower transistor is connected via a row select transistor to the sensor array column sensing line 38 that delivers the pixel signal to the periphery of the array for further processing. Row select control signal RS is asserted to activate the row select transistor to transfer the pixel signal to column sensing line 38. After charge sensing has been completed, floating diffusion node FD may be reset to supply voltage Vaa (e.g., a nominal positive power supply voltage provided on the power supply line) by asserting reset control signal RST to turn on the reset transistor. If desired, the storage gate can be reset at the same time as the floating diffusion node by simultaneously asserting signals RST and TX.

The global shutter image sensor pixel 34 shown in FIG. 3 is merely illustrative and is not intended to limit the scope of the present embodiments. This pixel scheme may be extended or applied to pixel architectures with two, three, four, or more charge storage nodes/regions sharing a common floating diffusion node for each pixel 34. In general, global shutter image sensor pixel 34 may include any number of storage gates, any number of capacitors, and any number of associated charge transfer, charge resetting, readout, conversion gain, and selection transistors for supporting a global shutter readout operation.

Figure 4:
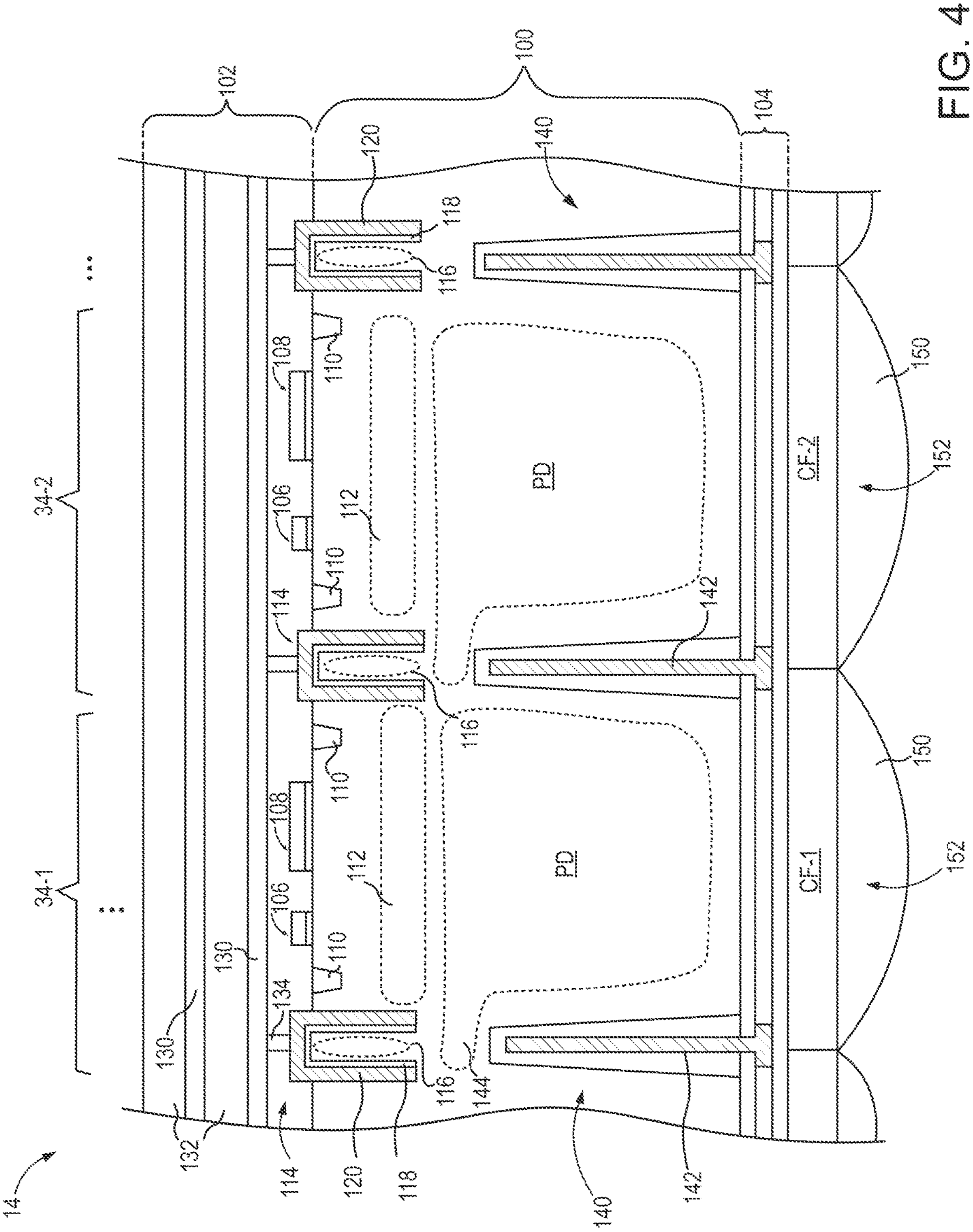
FIG. 4 is a cross-sectional side view of an illustrative backside illuminated image sensor with trench storage gate structures aligned with backside deep trench isolation structures in accordance with some embodiments.

FIG. 4 is a cross-sectional side view of an illustrative backside illuminated image sensor such as image sensor 14 in accordance with some embodiments. As shown in FIG. 4, image sensor 14 may include a substrate such as p-type (p-doped) semiconductor substrate 100, a frontside dielectric stack 102 formed on the front (upper) surface of substrate 100, and a backside dielectric stack 104 formed on the back (lower) surface of substrate 100.

FIG. 4 illustrates at least two adjacent image sensor pixels 34-1 and 34-2 formed in substrate 100. Each pixel may include at least a gate conductor 106 of the row select transistor, a gate conductor 108 of the source follower transistor, and additional pixel circuitry (not shown in this particular cross section) formed in the front surface of substrate 100. As shown in FIG. 4, the source follower transistor can be relatively wider than the other pixel transistors, which can help reduce read noise and increase frame rate (e.g., the SF transistor can be at least two times wider, more than 50% wider, 1-5 times wider, or 1-10 times wider than the row select transistor or other transistors in the pixel). The pixel structures of each pixel 34 may be at least partially surrounded by shallow trench isolation (STI) structures such as STI structures 110 formed in and at the front surface of substrate 100.

Each pixel 34 may also include a storage gate structure 114 formed at the front surface of substrate 100. Storage gate structure 114 may represent the storage gate controlled by signal SG in FIG. 3. Storage gate 114 may include gate conductor 120 formed within trenches of substrate 100. Gate conductor 120 may be formed from polysilicon, metal, or other suitable conductive gate material. An n-type (n-doped) potential well region 116 may be formed in a region of substrate 100 that is surrounded by gate conductor 120. A gate insulating liner 118 may be formed within the trenches at the interface separating gate conductor 120 and potential well 116. N-doped potential well 116 may serve as a buried channel region for storage gate 114. The buried channel region 116 may be at least partially surrounded by the trench in which trench gate conductor 120 is formed. Storage gate structure 114 configured in this way in which gate conductor 118 extends vertically into trenches formed within substrate 100 is sometimes referred to and defined herein as a trench transistor, a trench gate, a trench storage gate, or a trench gate transistor. A trench transistor (as defined herein) is different than a conventional planar transistor for which the gate conductor is formed on top of the front surface of substrate 100.

Implementing the storage gate as a trench transistor dramatically reduces the footprint of the storage gate, which allows for a large PD region and can help improve global shutter efficiency. A trench storage gate can have increased charge capacity because the area of the storage gate is not limited by the pixel size; simply increasing the depth of the trench storage gate increase the charge storage capacity. If desired, the charge transfer transistor that is controlled by signal TX (see FIG. 3) can also be implemented as a trench transistor.

The storage gate conductor 114 may be coupled to one or more metal layers in dielectric stack 102 using vertical vias 134. Dielectric stack 102 may include alternating metal routing layers 130 and dielectric layers 132 through which conductive vias can be formed. Dielectric stack 102 is sometimes referred to as an interconnect stack. Dielectric stack 102 may include at least two metal routing layers, at least three metal routing layers, four or more metal routing layers, five or more metal routing layers, six or more metal routing layers, or other number of conductive routing layers.

Deep trench isolation (DTI) structures such as DTI structures 140 may be formed in and at the back side of substrate 100. Deep trench isolation structures 140 may have a trench depth that is greater than that compared to shallow trench isolation structures 110. For example, DTI structures 140 may be at least 2×, 4×, 6×, 8×, 2-10×, or more than 10× deeper than the STI structures 110. Each pixel 34 may include a photodiode region PD that is at least partially surrounded by DTI structures 140. Each PD region may have a portion 144 that extends laterally beneath the channel region 116 of the associated storage gate structure 114. The region between buried channel 116 and PD portion 114 is a transfer region through which charge can be transferred from the photodiode to the global shutter storage node. A p-type (p-doped) well such as p-well 112 may be formed in substrate 100 for providing charge isolation between the photodiode region below well 112 and the planar transistor structures above well 112.

In particular, storage gates 114 may be laterally aligned with the DTI structures 140 (i.e., each storage gate 114 may be hidden under a corresponding backside deep trench isolation structure). In other words, the DTI structures 140 overlap with the storage gate structures 114 when viewing image sensor 14 from above (see plan view of FIGS. 5A-5C). Using the DTI structures to directly cover the storage gate nodes from the backside can help improve global shutter efficiency. The DTI structures 140 may be optionally filled with metal 142, which can provide light shielding capabilities and to reflect any stray light away from the storage gate structures. DTI structures having metal fill are sometimes referred to as light-blocking or light-shielding deep trench isolation structures.

Backside dielectric stack 104 may include at least one metal routing layer sandwiched between two dielectric layers. In other suitable arrangements, dielectric stack 104 may include at least two metal routing layers, at least three metal routing layers, four or more metal routing layers, five or more metal routing layers, six or more metal routing layers, or other number of conductive routing layers.

An array of color filter structures may be formed on dielectric stack 104. In the example of FIG. 4, a first color filter element CF-1 is formed over pixel 34-1, whereas a second color filter element CF-2 is formed over pixel 34-2. The color filter elements may be part of a color filter array having red color filter elements, green color filter elements, blue color filter elements, cyan color filter elements, magenta color filter elements, yellow color filter elements, black color filter elements, clear color filter elements, some combination of these color filter elements, and/or other color filter elements.

An array of microlens structures 150 may be formed over the color filter array. Each microlens 150 may be configured to direct incoming light 152 away from the storage gate regions. As an example, some of the microlens 150 can be configured to focus red light away from the storage gate nodes. As another example, some of the microlens 150 may be configured to focus blue light away from the storage gate nodes. As yet another example, some of the microlens 150 may be configured to focus green light away from the storage gate nodes. Image sensor 14 implemented as such is referred to as a backside illuminated image sensor because light 152 is entering the image sensor from the back (bottom) surface of substrate 100.

Figure 5A:
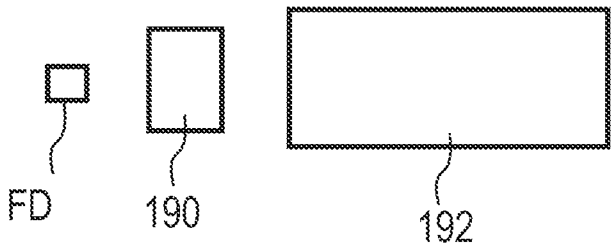
FIG. 5A is a top plan view of various illustrative pixel regions in accordance with some embodiments.

FIG. 5A is a top plan (layout) view of various illustrative pixel regions in accordance with some embodiments. As shown in FIG. 5A, a charge transfer gate 190 may be formed between the floating diffusion region FD and the storage gate 192. The footprint of the storage gate 192 can be dramatically smaller than the footprint of the underlying photodiode (see, e.g., FIG. 4).

Figure 5B:
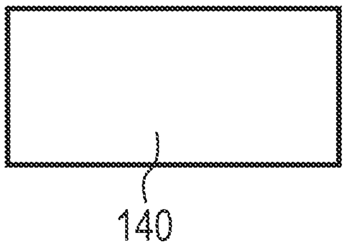
FIG. 5B is a top plan view of an illustrative backside deep trench isolation structure having the same footprint as the storage node region in accordance with some embodiments.
Figure 5C:
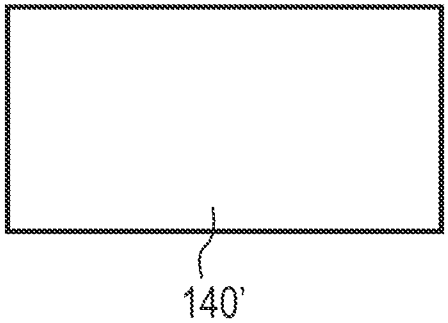
FIG. 5C is a top plan view of an illustrative backside deep trench isolation structure having a larger footprint than the storage node region in accordance with some embodiments.

FIG. 5B is a top plan view of an illustrative backside deep trench isolation structure 140 having the same footprint as the storage gate 192 shown in FIG. 5A. As described above, the backside DTI 140 can be formed directly under storage gate 192 to help provide shielding for the storage gate nodes. The example of FIG. 5B in which the footprint of DTI structure 140 is identical to that of the storage gate 192 is merely illustrative. FIG. 5C shows another example in which backside deep trench isolation structure 140' is configured with a larger footprint than storage gate 192. A relatively larger DTI footprint can help provide better light shielding capabilities but could impact the size of the surrounding photodiode regions.

Figure 6:
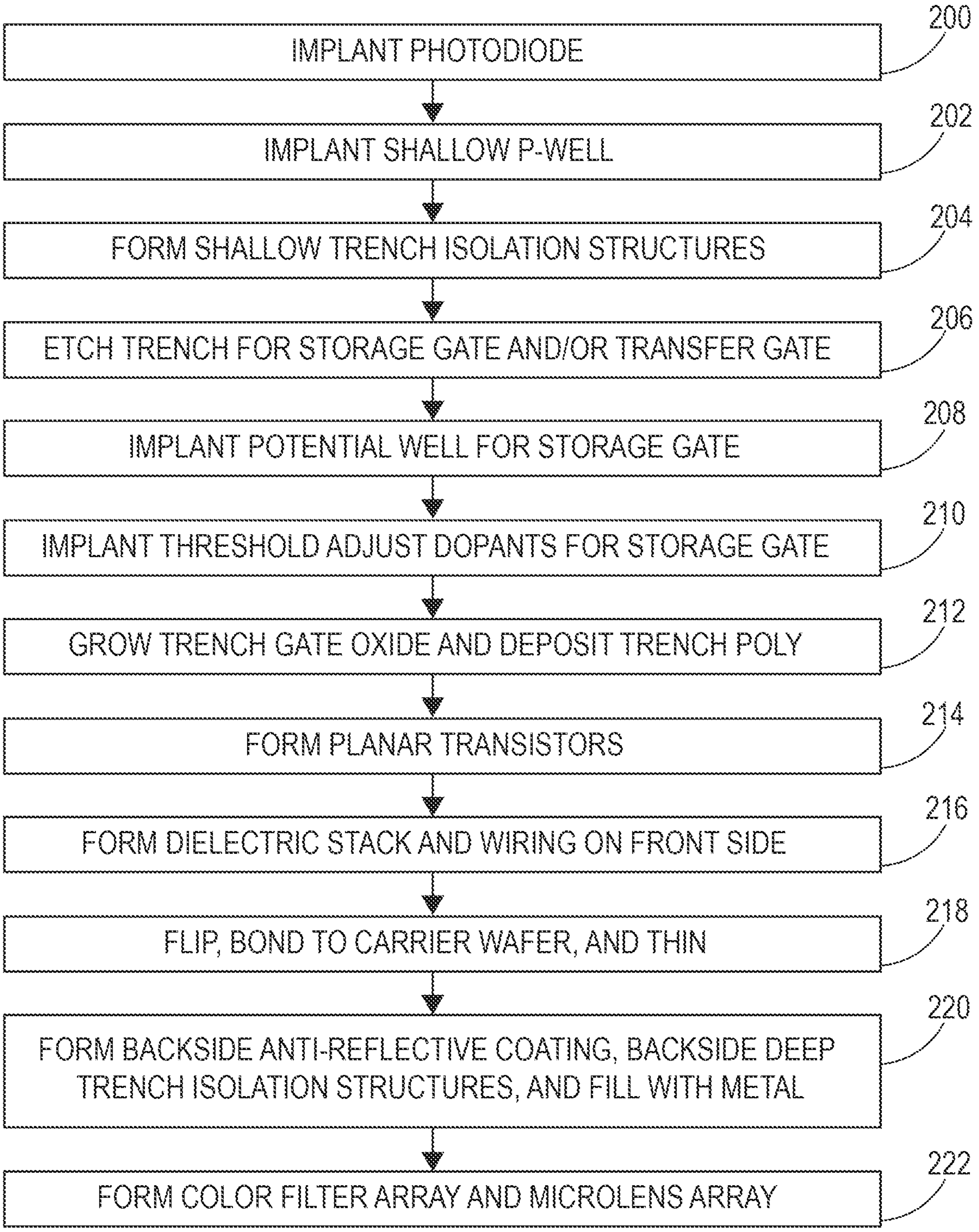
FIG. 6 is a flow chart of illustrative steps for manufacturing a backside illuminated image sensor of the type shown in FIG. 4 in accordance with some embodiments.

FIG. 6 is a flow chart of illustrative steps for manufacturing backside illuminated global shutter image sensor 14 of the type shown in FIG. 4 in accordance with some embodiments. At step 200, a photodiode PD is implanted from the front surface of the semiconductor substrate 100. As an example, photodiode PD can be formed by first performing a deep n-type dopant implant followed by a shallow n-type dopant implant.

At step 202, a shallow p-well 112 is implanted from the front surface of substrate 100.

At step 204, shallow trench isolation structures 110 can be formed at the front surface of substrate 100. The STI structures 110 may form an active area for the planar pixel transistors.

At step 206, trenches are etched for the storage gates (and/or optionally for the charge transfer gates). At step 208, a potential well 116 is implanted from the front surface of substrate 100 into the region of substrate 100 between the trenches. At step 210, threshold adjust dopants (e.g., p-type dopants) can be implanted for the storage gate. At step 212, the trench gate oxide liner 118 can be grown and conductive gate material such as polysilicon can be deposited into the trenches to form trench gate conductor 118.

At step 214, the planar transistors (e.g., row select transistor, source follower transistor, charge transfer transistor, reset transistor, and/or other pixel switching transistors) can be formed in the active area surrounded by the STI structures 110.

At step 216, dielectric stack 102 and associated interconnect wiring can be formed on the front side of substrate 100. At step 218, the image sensor can be flipped (capsized), bonded to a carrier wafer, and thinned to the desired thickness. A relatively thicker substrate 100 generally improves global shutter efficiency. For example, the thickness of substrate 100 can be greater than 5 microns, greater than 10 microns, greater than 1 micron, 1-10 microns, 5-10 microns, 10-20 microns, or other suitable thickness.

At step 220, a layer of anti-reflective coating can be formed on the back surface of substrate 100. The deep trench isolation structures can be formed in the back surface. The deep trench isolation structures can optionally be filled with metal or other light-blocking material.

At step 222, a color filter array can be formed on the back surface of substrate 100, and a microlens array can be formed over the color filter array.

These steps are merely illustrative. At least some of the described steps may be modified or omitted; some of the described steps may be performed in parallel; additional steps may be added or inserted between the described steps; the order of certain steps may be reversed or altered; or the timing of the described steps may be adjusted so that they occur at slightly different times.

Various embodiments are disclosed. In accordance with some embodiments, an image sensor is provided that includes a substrate having a front surface and a back surface, a photodiode formed in the substrate, a charge transfer transistor coupled to the photodiode and formed in the front surface of the substrate, a storage gate coupled between the photodiode and the charge transfer transistor, where the storage gate comprises a trench transistor formed in the front surface of the substrate, and a deep trench isolation structure formed in the back surface of the substrate, where the deep trench isolation structure is laterally aligned with the storage gate. The deep trench isolation structure can be filled with light-shielding material such as metal. The storage gate can include a gate conductor formed in a trench, a buried channel region at least partially surrounded by the trench, and a gate insulating layer between the gate conductor and the buried channel region. The storage gate can have a first footprint, whereas the deep trench isolation structure can have a second footprint that is identical or larger than the first footprint.

In accordance with some embodiments, a method of manufacturing an image sensor is provided that includes: obtaining a substrate having a front surface and a back surface, etching a trench in the front surface of the substrate, implanting a potential well in a region of the substrate at least partially surrounded by the trench, growing a gate oxide layer in the trench, depositing conductive gate material into the trench, and forming a deep trench isolation structure in the back surface of the substrate, where the deep trench isolation structure is aligned with the trench. The deep trench isolation structure can be filled with light-blocking material. The method can further include: forming planar transistors at the front surface of the substrate, forming a photodiode region in the substrate, and forming an isolation well between the photodiode region and the planar transistors.

In accordance with some embodiments, an image sensor pixel is provided that includes: a substrate having an upper surface and a lower surface, a trench transistor formed in the upper surface, and a deep trench isolation structure formed in the lower surface, where the deep trench isolation structure at least partially covers the trench transistor from the lower surface. The trench transistor can serve as a global shutter storage gate or can serve as a charge transfer transistor. The pixel can further include a photodiode region laterally surrounded by the deep trench isolation structure, where the photodiode region has a portion that extends into a region of the substrate between the trench transistor and the deep trench isolation structure.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:

a substrate having a front surface and a back surface;

a photodiode formed in the substrate;

a charge transfer transistor coupled to the photodiode and formed in the front surface of the substrate;

a storage gate coupled between the photodiode and the charge transfer transistor, wherein the storage gate comprises a trench transistor formed in the front surface of the substrate; and a deep trench isolation structure formed in the back surface of the substrate, wherein the deep trench isolation structure is laterally aligned with the storage gate; and wherein the photodiode has a portion that extends into a region between the storage gate and the deep trench isolation structure.

2. The image sensor of claim 1, wherein the deep trench isolation structure is filled with light-shielding material.

3. The image sensor of claim 2, wherein the light-shielding material comprises metal.

4. The image sensor of claim 1, wherein the storage gate comprises:

a gate conductor formed in a trench;

a buried channel region at least partially surrounded by the trench; and a gate insulating layer between the gate conductor and the buried channel region.

5. The image sensor of claim 4, further comprising:

a source follower transistor coupled to the charge transfer transistor and formed at the front surface of the substrate; and a charge isolation well between the photodiode and the source follower transistor.

6. The image sensor of claim 5, further comprising:

a row select transistor coupled in series with the source follower transistor, wherein the source follower transistor is wider than the row select transistor.

7. The image sensor of claim 1, wherein the charge transfer transistor comprises a planar transistor formed at the front surface of the substrate.

8. The image sensor of claim 1, wherein the charge transfer transistor comprises an additional trench transistor having a similar structure as the storage gate.

9. The image sensor of claim 1, wherein the storage gate has a first footprint and wherein the deep trench isolation structure has a second footprint that is identical to the first footprint.

10. The image sensor of claim 1, wherein the storage gate has a first footprint and wherein the deep trench isolation structure has a second footprint that is larger than the first footprint.

11. The image sensor of claim 1, further comprising:

a color filter element formed on the back surface of the substrate; and a microlens formed on the color filter element and configured to focus incoming light away from the storage gate.

12. A method of manufacturing an image sensor, comprising:

obtaining a substrate having a front surface and a back surface;

forming a photodiode region in the substrate;

etching a trench in the front surface of the substrate;

implanting a potential well in a region of the substrate at least partially surrounded by the trench;

growing a gate oxide layer in the trench;

depositing conductive gate material into the trench; and forming a deep trench isolation structure in the back surface of the substrate, wherein the deep trench isolation structure is aligned with the trench; and wherein the photodiode region is at least partially surrounded by the deep trench isolation and has a portion that extends between the trench and the deep trench isolation structure.

13. The method of claim 12, further comprising:

filling the deep trench isolation structure with light-blocking material.

14. The method of claim 12, further comprising:

forming planar transistors at the front surface of the substrate; and forming an isolation well between the photodiode region and the planar transistors.

15. The method of claim 12, further comprising:

forming a row select transistor at the front surface of the substrate; and forming a source follower transistor at the front surface of the substrate, the source follower transistor being at least 50% wider than the row select transistor.

16. An image sensor pixel, comprising:

a substrate having an upper surface and a lower surface;

a trench transistor formed in the upper surface; and a deep trench isolation structure formed in the lower surface, wherein the deep trench isolation structure at least partially covers the trench transistor from the lower surface; and a photodiode region at least partially laterally surrounded by the deep trench isolation structure, wherein the photodiode region has a portion that extends into a region of the substrate between the trench transistor and the deep trench isolation structure.

17. The image sensor pixel of claim 16, wherein the trench transistor comprises a global shutter storage gate.

18. The image sensor pixel of claim 16, further comprising:

a photodiode formed in the substrate; and a floating diffusion region formed in the substrate, wherein the trench transistor comprises a charge transfer transistor coupled between the photodiode and the floating diffusion region.

* * * * *